United States Patent
Lesea

(10) Patent No.: US 7,403,051 B1
(45) Date of Patent: Jul. 22, 2008

(54) DETERMINING VOLTAGE LEVEL VALIDITY FOR A POWER-ON RESET CONDITION

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 25 days.

(21) Appl. No.: 11/340,389

(22) Filed: Jan. 26, 2006

(51) Int. Cl.
- *H03L 7/00* (2006.01)
- *H03K 5/153* (2006.01)
- *H03K 5/22* (2006.01)

(52) U.S. Cl. .......................... 327/143; 327/76; 327/77; 327/142; 327/198

(58) Field of Classification Search .................. 327/77, 327/142, 143, 198, 74, 76
See application file for complete search history.

(56) References Cited

U.S. PATENT DOCUMENTS

| | | | |
|---|---|---|---|
| 5,739,708 A * | 4/1998 | LeWalter | 327/143 |
| 6,085,327 A * | 7/2000 | Seng et al. | 713/300 |
| 6,956,414 B2 * | 10/2005 | Sweet | 327/142 |
| 7,057,427 B2 * | 6/2006 | Wadhwa et al. | 327/143 |
| 2005/0189970 A1 * | 9/2005 | Nakatake et al. | 327/143 |
| 2006/0119384 A1 * | 6/2006 | Camarota et al. | 326/38 |

* cited by examiner

*Primary Examiner*—Quan Tra
*Assistant Examiner*—Colleen O'Toole
(74) *Attorney, Agent, or Firm*—W. Eric Webostad

(57) ABSTRACT

Determining voltage level validity for a power-on reset condition is described. A supply voltage is applied to an integrated circuit. An oscillating signal is generated responsive to the supply voltage applied. A counting occurs responsive to oscillations of the oscillating signal. A triggering occurs responsive to reaching a first voltage level of the supply voltage for the power-on reset condition. A first count of the counting occurs responsive to the triggering. A second count is selected responsive to the first count. A second level is accepted as having at least met a threshold for the supply voltage responsive to the counting reaching the second count for the power-on reset condition.

13 Claims, 6 Drawing Sheets

US 7,403,051 B1

DETERMINING VOLTAGE LEVEL VALIDITY FOR A POWER-ON RESET CONDITION

FIELD OF THE INVENTION

One or more aspects of the invention relate generally to integrated circuits and, more particularly, to determining voltage level validity for a power-on reset condition.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

A certain amount of supply current during a power-up of an integrated circuit is used to ensure proper initialization. The actual current consumed depends on the power-up ramp rate of the power supply used. Additionally, one or more supply voltages may first have to pass through their power-on reset threshold voltage level or levels for an integrated circuit to properly power up. An example of such a threshold voltage level may be a supply voltage rise-time limit, such as from initiation of a power-on reset condition, including a power-up condition. From the time of initiation of a power-on reset, power-on reset threshold voltage level or levels are to be at least met for a supply voltage or supply voltages, respectively, within a rise-time window.

A manufacturer of an integrated circuit may specify particular minimum supply currents and a maximum supply voltage level rise time in order for a customer to select a power supply meeting those specifications. To reduce cost of power supplies needed for use of an integrated circuit, power-on reset circuits may trip relatively late within a supply voltage rise-time window and still properly initialize the integrated circuit. However, with the scaling down in size of integrated circuits, there has been a commensurate reduction in supply voltage level. This has meant that a variation in a supply voltage level has a narrower voltage difference window than previously allowed. This scaling down has also meant less predictability of transistor-threshold voltage, meaning that variation in power-on reset circuit trip points may be large compared with a supply voltage level, which presently is generally one volt or less. Building power-on reset circuits having sufficient precision may be too costly and may add significant complexity.

Accordingly, it would both desirable and useful to provide means for determining supply voltage level validity using a conventional power-on reset circuit.

SUMMARY OF THE INVENTION

One or more aspects of the invention generally relate to integrated circuits and, more particularly, to determining voltage level validity for a power-on reset condition.

An aspect of the invention is a method for determining voltage level validity for a power-on reset condition. A supply voltage is applied to an integrated circuit. An oscillating signal is generated responsive to the supply voltage applied. A counting occurs responsive to oscillations of the oscillating signal. A first triggering occurs responsive to reaching a first voltage level of the supply voltage for the power-on reset condition. A first count of the counting is captured responsive to the first triggering. A second triggering occurs responsive to reaching a second voltage level of the supply voltage for the power-on reset condition. A second count of the counting is captured responsive to the second triggering, the second voltage level being greater than the first voltage level and the second count being greater than the first count. A rate of change is determined as between the first voltage level and the second voltage level. A third count greater than the second count is selected, the third count indicating an amount of additional time to wait to reach a third voltage level for the supply voltage.

Another aspect of the invention is a method for determining voltage level validity for a power-on reset condition. A supply voltage is applied to an integrated circuit. An oscillating signal is generated responsive to the supply voltage applied. A counting occurs responsive to oscillations of the oscillating signal. A triggering occurs responsive to reaching a first voltage level of the supply voltage for the power-on reset condition. A first count of the counting occurs responsive to the triggering. A second count is selected responsive to the first count. A second level is accepted as having at least met a threshold for the supply voltage responsive to the counting reaching the second count for the power-on reset condition.

Yet another aspect of the invention is a voltage level validity circuit of an integrated circuit for a power-on reset condition. A first power-on reset circuit is coupled to receive a first supply voltage and configured to provide a first change in output state responsive to the first supply voltage reaching a first threshold level. An oscillator is coupled to receive the first supply voltage and configured to provide an oscillating signal. The oscillating signal has a frequency which is a function of voltage level of the first supply voltage. A counter is coupled to receive the oscillating signal and configured to count responsive to the oscillating signal. A first latch is coupled to the counter and to the first power-on reset circuit. The first latch is configured to store a first count of the counter. The first latch is configured to output the first count of the counter responsive at least in part to the first change in output state of the first power-on reset circuit. A select circuit is coupled to receive the first count from the first latch and configured to select a target count of the counter, the target count being greater than the first count reached. The target count indicating when at least the first supply voltage will have reached at least a first minimum level specified for the first supply voltage.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
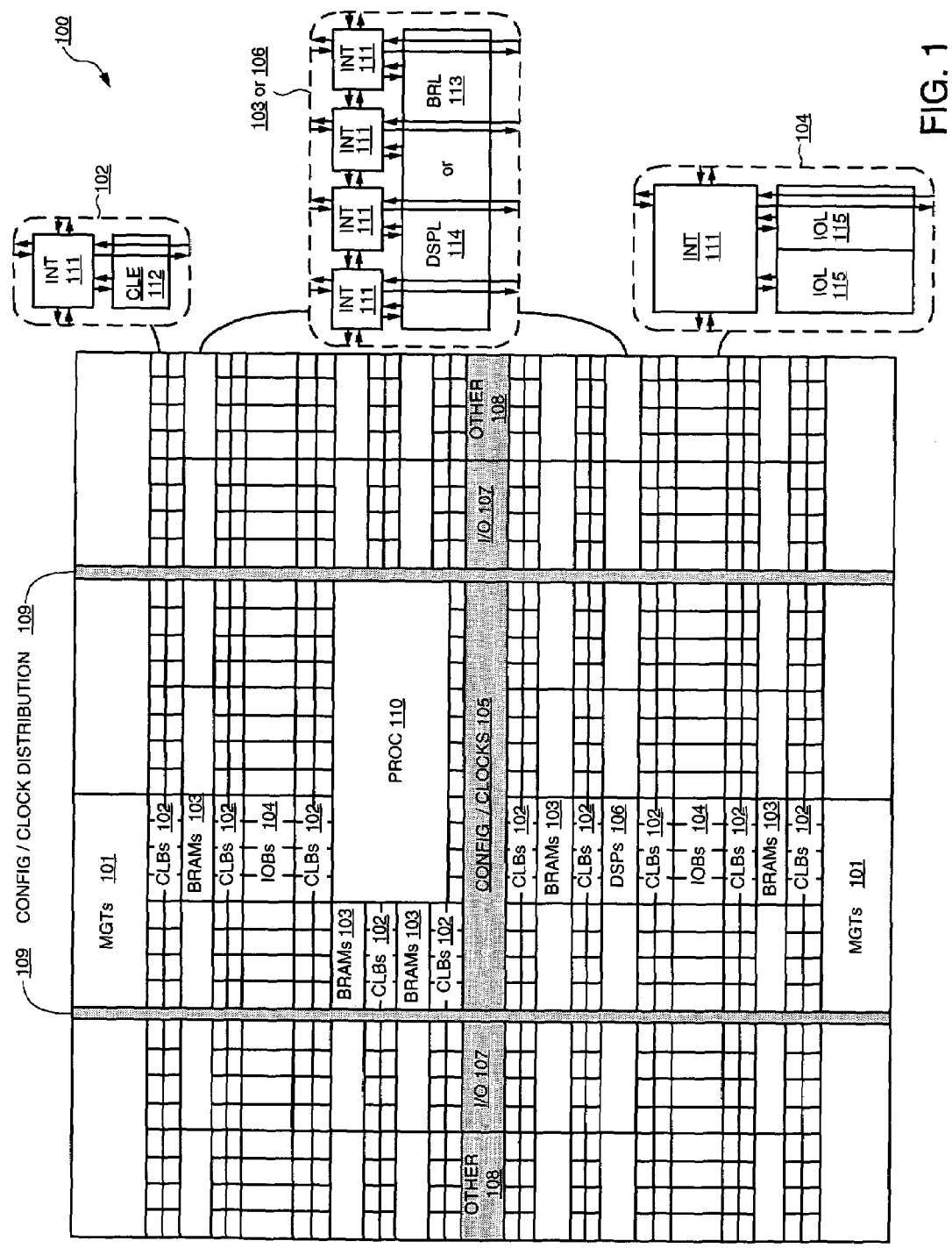
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Although an FPGA is used as an example of an integrated circuit, it should be appreciated that any of a variety of known types of integrated circuits having power-on reset condition may be used.

Figure 2:
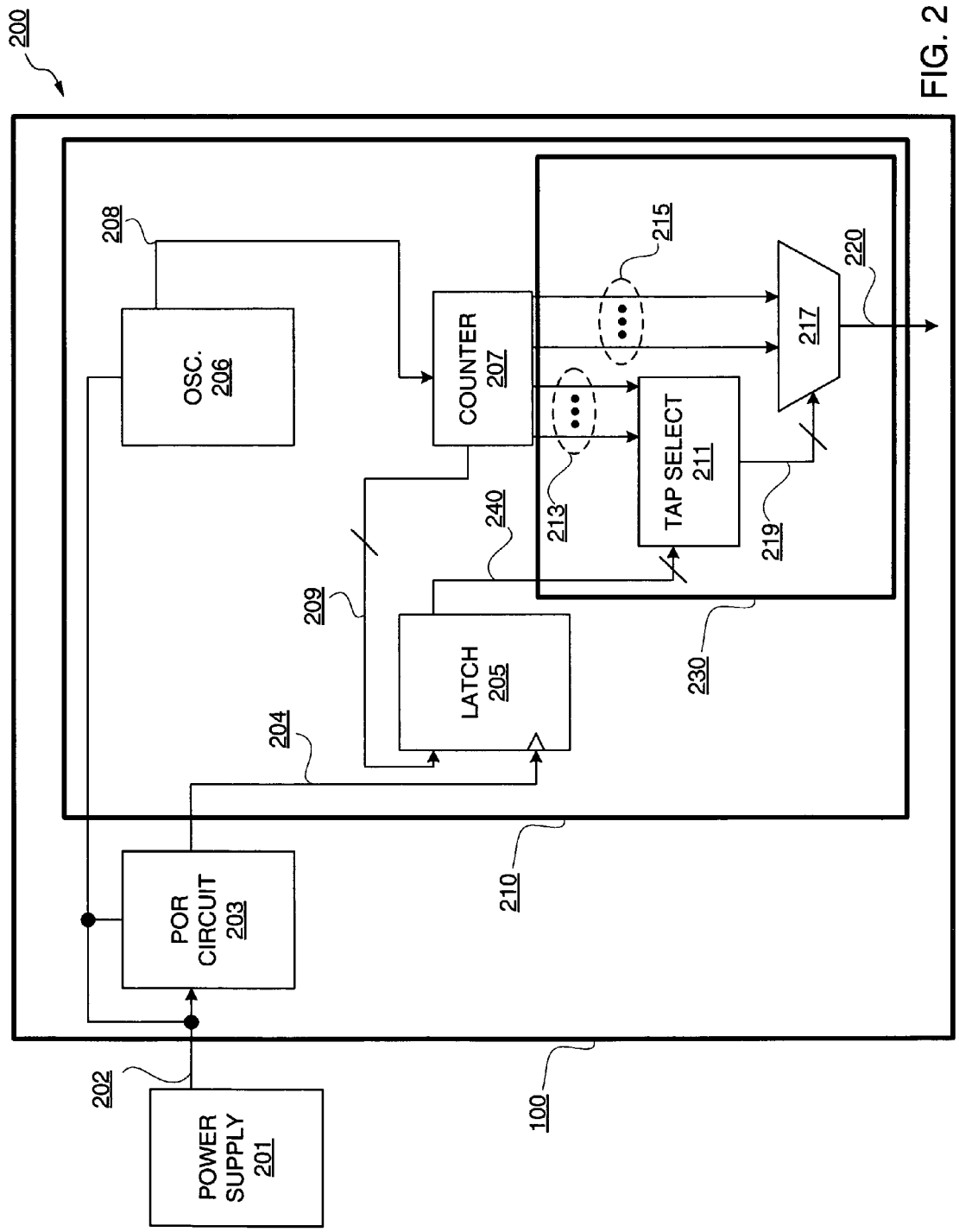
FIG. 2 is a block diagram depicting an exemplary embodiment of a power supply-FPGA system.

FIG. 2 is a block diagram depicting an exemplary embodiment of a power supply-FPGA system 200. Power supply 201 is coupled to FPGA 100 to provide a supply voltage ("Vdd") 202 to FPGA 100. Supply voltage 202 is provided to power-on reset ("POR") circuit 203 of FPGA 100 as both an input voltage and a bias voltage. POR circuit 203 is a conventional POR circuit. For example, POR circuit 203 may be a buffer or an inverter where transistors are sized to cause output of POR circuit 203 to change state responsive to meeting a percentage of a target supply voltage level. For purposes of clarity by way of example and not limitation, it shall be assumed that the target supply voltage level is one volt; however, it will be appreciated that any supply voltage level may be used. Thus, for example, POR circuit 203 receiving a ramping supply voltage 202 may initially output a logic 0 for percent Vdd signal 204, until at least a threshold percentage of the supply voltage level of one volt is met. For purposes of clarity by way of example, it shall be assumed that the percentage to be met is approximately one half of the supply voltage level, namely 0.5 volts in this example. However, it should be appreciated that other percentage values may be used. After reaching the 0.5 volt threshold by supply voltage 202, POR circuit 203 transitions from providing a logic 0 to providing a logic 1 output for percent Vdd signal 204. Notably, supply voltage levels generally are specified as a minimum and a maximum supply voltage level, or a supply voltage level plus some percentage or minus some percentage, or any combination thereof.

POR circuit 203 is coupled to power level valid circuit 210 of FPGA 100. Power level valid circuit 210 includes counter 207, latch 205, oscillator 206, and select circuit 230. Select circuit 230 includes tap select circuit 211 and multiplexer 217. Power level valid circuit 210 is coupled to receive supply voltage 202 to an oscillator 206. Moreover, power level valid circuit 210 is coupled to receive output of POR circuit 203, namely percent Vdd signal 204, to a latch 205. Continuing the above example, it shall be assumed that latch 205 is a positively triggered latch. However, it should be appreciated that although particular logic states are described, the opposite state may be used depending on the implementation.

Oscillator 206 may be a "free-running" oscillator responsive to supply voltage 202 provided from power supply 201. Thus, oscillator 206 provides an oscillating signal 208 having a frequency which is a function of the voltage amplitude of supply voltage 202. Output of oscillator 206 is provided to counter 207. Thus, for example, counter 207 may count each oscillation, pulse, or cycle, or variation thereof, of oscillating signal 208. Output of counter 207, namely count signal 209, is provided as a data input to latch 205. Notably, in this particular implementation, latch 205 is described in terms of use of a flip-flop. However, it will be appreciated by those of ordinary skill in the art that any of a variety of known types of circuits may be used to latch data.

Once POR circuit 203 has reached a trip point, percent Vdd signal 204 causes latch 205 to output a then-current count of count signal 209. Output of latch 205, namely latch output signal 240, is provided to a tap select circuit 211. Tap select circuit 211 is coupled to outputs or taps of counter 207. In this particular example, the Least Significant Bits ("LSBs") may be provided to tap select circuit 211, namely LSB outputs 213. Tap select circuit 211 is configured to select a count value, namely a target count value, responsive to state of LSB outputs 213 when latch output signal 240 is provided to tap select circuit 211 from latch 205. Notably, no encoding of bits need be done, as tap select circuit 211 may merely be configured to provide a shift of bits, such as may be implemented by a bit shifter, to select an associated Most Significant Bit ("MSB") output of counter 207, namely MSB outputs 215. This shifting of bits may be fixed, namely a fixed number of bit positions to shift.

Tap select circuit 211 provides select signal 219 to multiplexer ("MUX") 217. Notably, the width of count signal 209, latch output signal 240, and select signal 219 is not specified because any of a variety of bit widths of one or greater of one or more of these signals may be used, as will vary from application to application depending for example on the size of the voltage level rise-time window and frequency of oscillator signal 208. Accordingly, single blocks, such as for latch 205 and counter 207 for example, are used to represent multiple flip-flops for purposes of clarity. Data input to multiplexer 217 is provided by coupling multiplexer 217 to MSB taps or outputs, namely MSB outputs 215, of counter 207. Responsive to select signal 219, an MSB output of MSB outputs 215 is selected for output from multiplexer 217 as valid signal 220. Valid signal 220 indicates that at least a minimum supply voltage threshold level has been met.

Thus, it should be appreciated that although POR circuit 203 may be a very uncomplicated circuit, when a POR circuit is coupled with power level valid circuit 210, a relatively accurate prediction as to when a supply voltage threshold level will be reached may be made responsive to a targeted count. Notably, it may be that a supply voltage threshold level cannot be met within a specified rise time, as specified by a manufacturer of the integrated circuit, for example FPGA 100, because the power supply selected is not capable of meeting the specified rise time. In such an instance, tap select circuit 211 may not have an LSB output 213 associated with an MSB 215 output for providing select signal 219, and thus valid signal 220 would not be asserted. In other words, FPGA 100 may fail to initialize or initialize properly.

Figure 3:
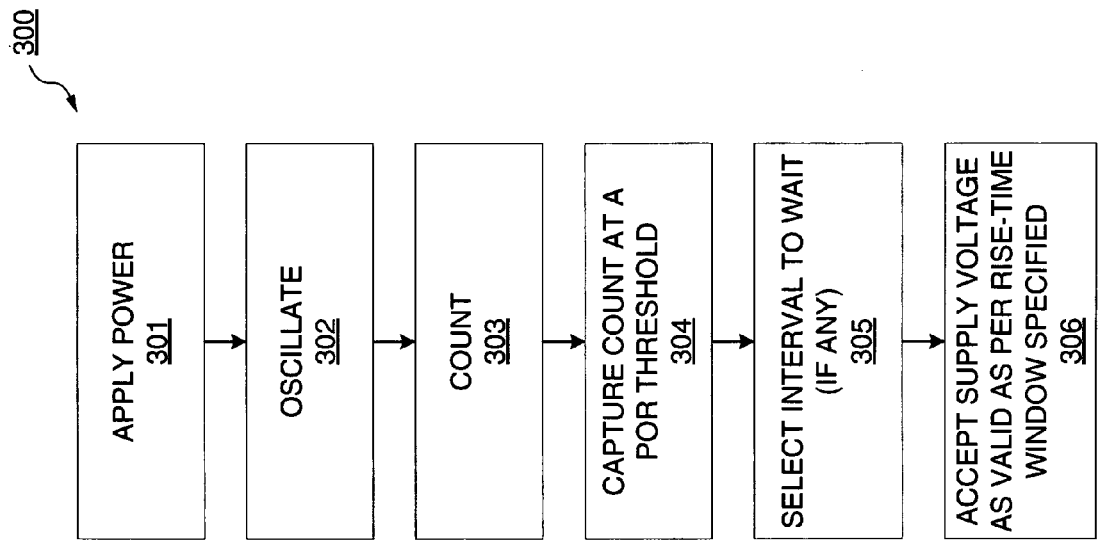
FIG. 3 is a flow diagram depicting an exemplary embodiment of a power-on reset flow.

FIG. 3 is a flow diagram depicting an exemplary embodiment of a power-on reset flow 300, such as described with reference to FIG. 2 for example. At 301, power is applied to an integrated circuit. At 302, in response to the application of power at 301, an oscillator begins oscillating. At 303, a counter counts responsive to oscillations of the oscillator initiated at 302.

At 304, a POR circuit trips, causing the output state of such POR circuit to transition. This tripping by the POR circuit causes the count of the counter initiated at 303 to be latched, or otherwise captured. Responsive to the count value captured at 304, at 305 an interval is selected to provide a waiting period for the supply voltage level to reach a specified threshold or range thereof within a specified rise-time window. Such specified threshold or range is provided by the integrated circuit manufacturer. At 305, it may be determined that voltage is rising too slowly to meet a specified rise-time window, in which event no acceptance of a valid supply voltage will result, namely operation 306 will not occur.

At 306, it is assumed that the voltage rises as predicted, for example within the specified rise-time window. Notably, the reliability of this assumption may be substantially high by having a relatively long rise-time window. Thus, at 306 supply voltage is accepted as being a valid voltage level. In other words, power-on reset flow 300 is predictive, as the actual voltage level reached at 306 is not necessarily actually measured, but is accepted as having been reached owing to the captured count being sufficiently low that the interval selected at 305 will be within the rise-time window specified. Thus, the prediction is that the supply voltage will have reached at least a minimum voltage of a range of a specified supply voltage level. The interval selected at 305 may merely be a multiple of the count captured, so for example if the count captured is a value X, the selected interval may be 1×, 2×, 4×, 8×, or some other multiple of X as selected as an additional time to wait. Notably, although binary integer multiples are used for convenience, it should be understood that non-binary, as well as non-integer, multiples may be used. The additional time to wait may vary depending on what percentage of supply voltage causes triggering of a POR circuit. Thus, for example, if the triggering point is one third the value of a target Vdd level, the multiple used at 305 may be larger than if the triggering point was one half the value of a target supply voltage level.

An integrated circuit may use multiple types of supply voltages. For example, there may be Vdd, Vcc, Vcco, Vcc Int, or Vcc Aux, or any combination thereof, as supply voltages for known types of integrated circuits. As is known, Vdd and Vcc are examples of DC logic-high supply voltage levels. Furthermore, as is known, Vcco, Vcc Int, and Vcc Aux are separate DC supply voltages of an FPGA as detailed for example in the "Virtex V4 FPGA Handbook" of August 2004, for example at pages 31-37. The different supply voltages may be provided by one power supply having multiple taps or may be provided by multiple power supplies.

Figure 4:
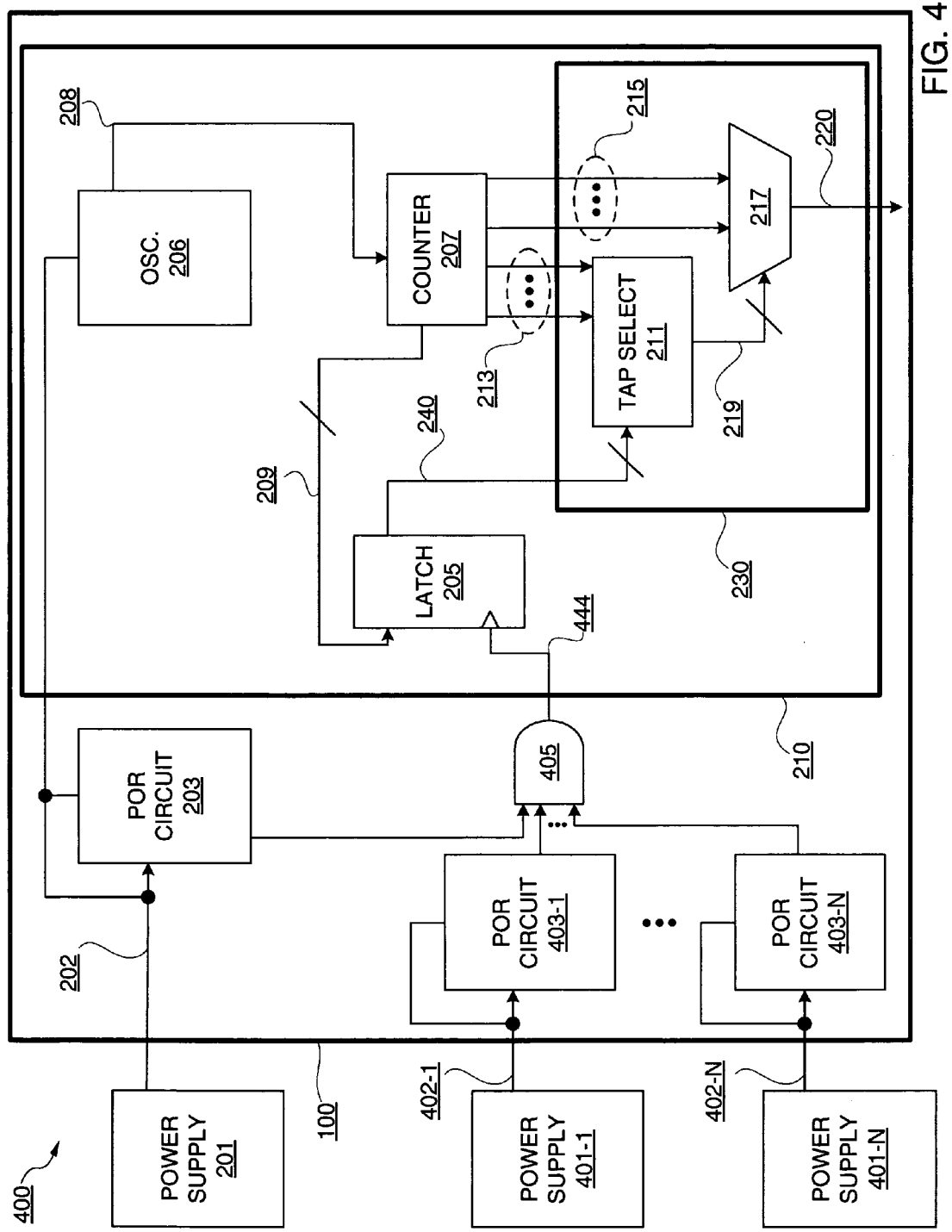
FIG. 4 is a block/schematic diagram depicting an exemplary embodiment of a power supply-FPGA system where more than one type of supply voltage is used.

FIG. 4 is a block/schematic diagram depicting an exemplary embodiment of a power supply-FPGA system 400 where more than one type of supply voltage is used. Power supply-FPGA system 400 is similar to power supply-FPGA system 200 of FIG. 2. However, in this particular embodiment, power supplies 401-1 through 401-N have been added to respectively provide supply voltages 402-1 through 402-N. Supply voltages 402-1 through 402-N are respectively provided to POR circuits 403-1 through 403-N. Notably, like POR circuit 203, which receives supply voltage 202 as a bias voltage and an input voltage, likewise POR circuits 403-1 through 403-N respectively receive supply voltages 402-1 through 402-N as both input and bias voltages. Notably, the value of N depends on the number of supply voltages, in addition to supply voltage 202, provided to FPGA 100, and thus N is a positive integer equal to or greater than one. Outputs of each of POR circuit 203 and POR circuits 403-1 through 403-N are provided as inputs to gating logic. In this particular example, an AND gate 405 is used for gating logic; however, it shall be appreciated by those of ordinary skill in the art that any of a variety of known types of gating logic circuits may be implemented. Output of AND gate 405 is percent Vdd 444, and is provided to latch 205 of power level valid circuit 210. As power level valid circuit 210 has previously been described, its description is not repeated.

In the above examples, it has been assumed that there is a specified rise-time window within which time a supply voltage provided shall at least obtain a lower boundary of a specified supply voltage range and may pass through such lower boundary. Timing from an initial application of power to a tripping of a POR circuit is an initial time interval from which it may be determined how much additional time to wait. This waiting period may be set to provide a high degree of certainty that a supply voltage will have reached at least a minimum voltage level of a specified supply voltage range. However, although a rise-time window may be specified, it need not be. In such instances, a target rate of change of a supply voltage may be specified in order to predict when such supply voltage will reach at least a minimum supply voltage level specified.

Figure 5:
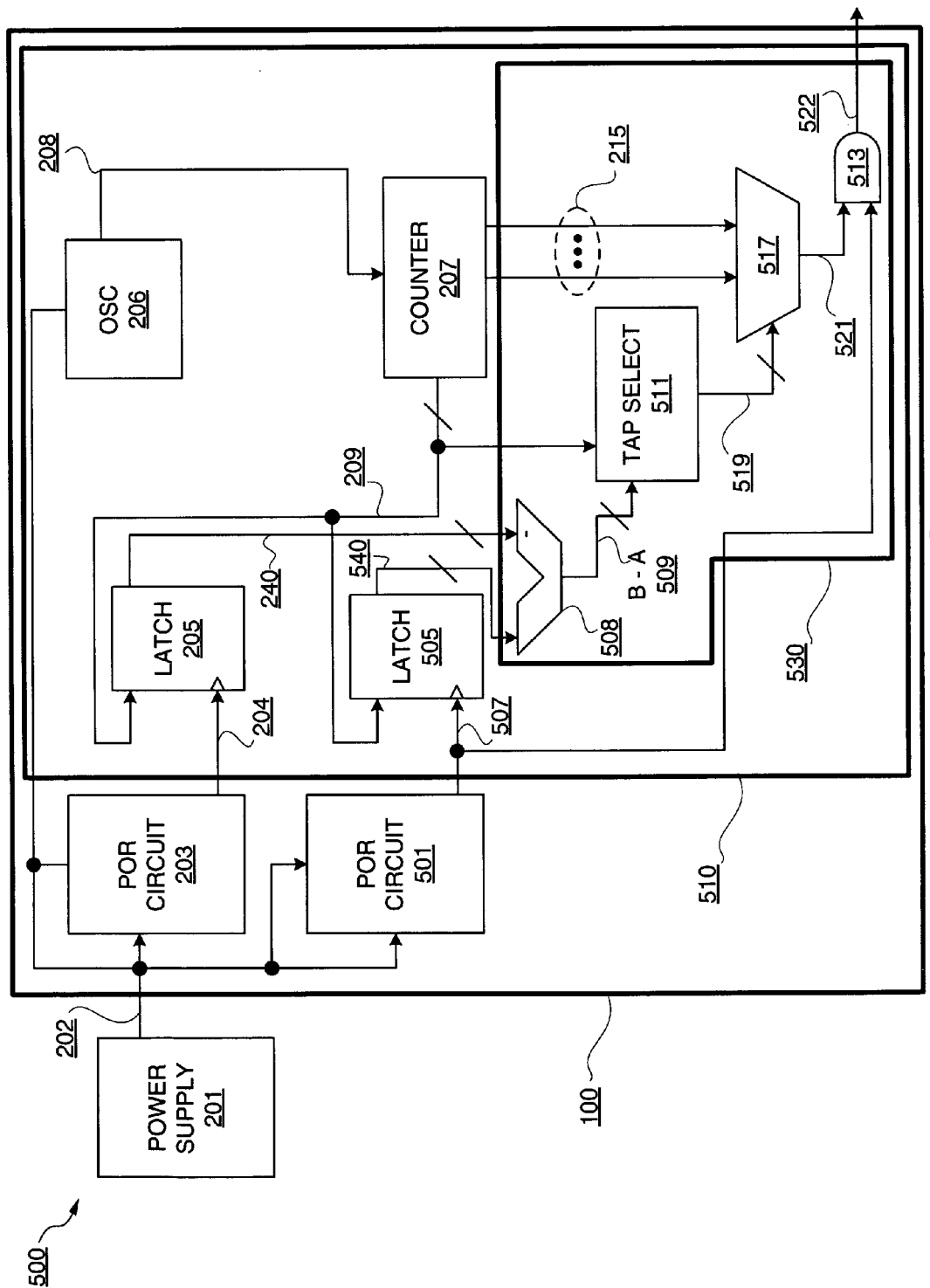
FIG. 5 is a block/schematic diagram depicting an exemplary embodiment of a power supply-FPGA system.

FIG. 5 is a block/schematic diagram depicting an exemplary embodiment of a power supply-FPGA system 500. Power supply-FPGA system 500 of FIG. 5 is similar to power supply-FPGA system 200 of FIG. 2 except for the addition of POR circuit 501, latch 505, and a change in select circuitry, namely select circuit 530 rather than select circuit 230 in forming power level valid circuit 510 rather than power level valid circuit 210. Accordingly, for purposes of clarity, generally only the differences between systems 200 and 500 are described with reference to FIG. 5.

Power supply 201 provides a supply voltage, Vdd 202, as an input and a bias voltage to POR circuit 501 of FPGA 100. Output of POR circuit 501 is coupled to latch 505. This output, namely percent Vdd signal 507, is used to cause latch 505 to latch the count obtained from counter 207 via count signal 209. In this particular example, it shall be assumed that POR circuit 203 has a tripping point of one third of a target Vdd, which in continuing the above example is one volt, and POR circuit 501 has a tripping point which is two thirds the target Vdd level, again namely one volt in continuance of the above example. Notably, these particular numerical values are provided for purposes of clarity by way of explanation, and it should be appreciated that other numerical values may be used. Thus, latch 205 will latch the count obtained from counter 207 via count signal 209 or, more particularly, the then-current count of counter 207, prior to latch 505.

Latch output signal 240 is provided to a negative input port of adder ("subtractor") 508, and output of latch 505, namely latch output signal 540, is provided to a positive input port of subtractor 508. Thus, at some time later in the count of counter 207, latch 505 will latch a then-current count responsive to output 507 of POR circuit 501 changing state. For purposes of clarity, the output of latch 205 shall hereinafter be referred to as A, and the output of latch 505 shall hereinafter be referred to as B.

Subtractor 508 thus effectively performs a mathematical operation which is the subtraction of A from B to produce B-A output signal 509 which is provided as an input to tap select circuit 511. Responsive to B-A output signal 509, tap select circuit 511 provides control select signal 519 to multiplexer 517. It should be appreciated that effectively B-A indicates the rate of change, such as the slope, of the rise-time curve of supply voltage 202. Knowing the rate of change of supply voltage 202, it may be determined how much longer it will take for supply voltage to at least reach a minimum value of a supply voltage specified range.

Accordingly, tap select circuit 511 is configured to select an MSB output of MSB outputs 215 responsive to B-A output signal 509 via control select signal 519 provided to multiplexer 517. As previously described with reference to FIG. 2, MSB outputs 215 of counter 207 are provided as data inputs to multiplexer 517. Thus, once counter 207 reaches the MSB output selected responsive to control select signal 519, valid signal 521 may provide a logic high output. Optionally, as illustratively shown in FIG. 5, valid signal 521 may be provided as an input to AND gate 513, and another input to AND gate 513 may be percent Vdd signal 507. Once both inputs to AND gate 513 are logic highs, AND gate 513 may output a confirm valid signal 522 having a logic high state.

Accordingly, it should be appreciated that counter 207 provides two counts, which are both latched, though at different times. The first count, which is latched by latch 205, is less than the second count, which is latched by latch 505. From the difference between these two counts, effectively a third count may be selected by selecting an MSB output indicating that there is an additional amount of time to wait before reaching a target voltage level or range. Notably, it may take some time for tap select circuit 511 to identify a target count for outputting select signal 519; such latency may be due to bit shifting. Thus, depending on the rate of change of the supply voltage, it may be that the MSB output to be selected has already been transitioned from a logic 0 to a logic 1 state by the time a target count is identified. Accordingly, output of counter 207, namely count signal 209, may be provided to tap select circuit 511 such that a next MSB output, or a near-time MSB output, may be selected via select signal 519 to cause multiplexer 517 to generally output a logic 1 immediately.

Counter 207 may have any of a variety of different types of known counter implementations. However, as the frequency of free-running oscillator 206 may extend into the megahertz or higher frequencies, each stage of counter 207 may be a divide-by-two. For example, counter 207 may have 24 stages where each stage is a subsequent divide-by-two by chaining toggle flip-flops in series. This facilitates using a high-frequency free-running oscillator by having more flip-flops in counter 207 as opposed to attempting to construct a non-free-running oscillator where frequency is substantially constrained.

Figure 6:
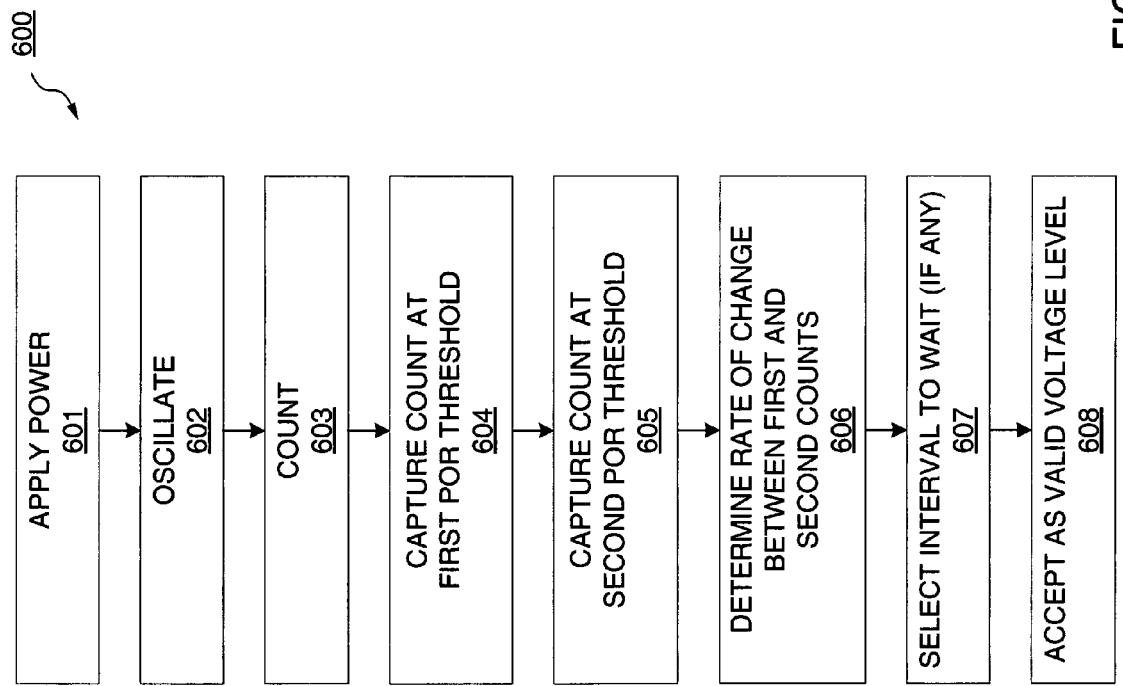
FIG. 6 is a flow diagram depicting an exemplary embodiment of a power-on reset flow for determining rate of change, such as described with reference to FIG. 5 for example.

FIG. 6 is a flow diagram depicting an exemplary embodiment of a power-on reset flow 600 for determining rate of change, such as described with reference to FIG. 5 for example. At 601, power is applied. At 602, an oscillating signal begins oscillating responsive to application of power at 601. At 603, counting of pulses of the oscillating signal is initiated. At 604, responsive to a first POR threshold or tripping point, a first count as initiated at 603 is captured. At 605, some time after the first threshold or tripping point of a POR circuit has occurred, a second threshold or tripping point is reached, causing capturing of a second count, which is larger than the count captured at 604.

At 606, a rate of change is determined between the first and second counts. At 607, it is determined whether more time is needed to reach a target supply voltage range, and an interval to wait is selected by selecting a count output corresponding to the additional time needed, if any. At 607, it may be determined that there is no interval to select for which supply voltage will have sufficiently risen to meet a rise-time window, and thus power-on reset flow 600 will not reach 608. At 608, assuming the voltage level has been reached after the interval selected at 607 has passed, the supply voltage provided as part of application of power at 601 is accepted as having a valid voltage level.

While the foregoing describes exemplary embodiment(s) in accordance with one or more aspects of the invention, other and further embodiment(s) in accordance with the one or more aspects of the invention may be devised without departing from the scope thereof, which is determined by the claim (s) that follow and equivalents thereof. Claim(s) listing steps do not imply any order of the steps. Trademarks are the property of their respective owners.

What is claimed is:

1. A method for determining voltage level validity for a power-on reset condition, comprising:
    applying a supply voltage to an integrated circuit;
    receiving the supply voltage in a first power-on reset circuit of the integrated circuit;
    generating an oscillating signal responsive to the supply voltage applied, the oscillating signal having a frequency which is a function of the first supply voltage level;
    counting oscillations of the oscillating signal;
    storing a first count of the oscillations of the oscillating signal;
    outputting the first count in response to a first change in output state of the first power-on reset circuit;
    selecting a target count of oscillations of the oscillating signal, the target count being greater than the first count and indicating that the supply voltage has reached at least a first minimum level specified for the supply voltage;
    triggering a first power-on reset responsive to reaching a first voltage level of the supply voltage for the power-on reset condition;
    receiving the supply voltage in a second power-on reset circuit;
    storing a second count of the oscillations of the oscillating signal;
    outputting the second count in response to a second change in output state of the second power-on reset circuit;
    triggering a second power-on reset responsive to reaching a second voltage level of the supply voltage for the power-on reset condition;
    receiving the first count and the second count;
    determining a rate of change between the first voltage level and the second voltage level responsive to a difference between the first count and the second count; and
    selecting a third count greater than the second count, the third count indicating an amount of additional time to wait to reach a third voltage level for the supply voltage.

2. The method according to claim 1, wherein the third voltage level is specified by a manufacturer of the integrated circuit.

3. The method according to claim 2, wherein the third voltage level is specified by the manufacturer to be reached by a rise-time threshold.

4. The method according to claim 3, wherein the third voltage level is specified by the manufacturer to be part of a voltage range.

5. The method according to claim 1, wherein the supply voltage is provided as part of powering up the integrated circuit, the powering-up having a ramp rate associated with a power supply used to provide the supply voltage.

6. The method according to claim 5, wherein the integrated circuit is a Field Programmable Gate Array.

7. A voltage level validity circuit of an integrated circuit for a power-on reset condition, comprising:
    a first power-on reset circuit coupled to receive a first supply voltage and configured to provide a first change in output state responsive to the first supply voltage reaching a first threshold level;
    an oscillator coupled to receive the first supply voltage and configured to provide an oscillating signal;
    the oscillating signal having a frequency which is a function of voltage level of the first supply voltage;
    a counter coupled to receive the oscillating signal and configured to count responsive to the oscillating signal during the power-on reset condition;
    a first latch coupled to the counter and to the first power-on reset circuit;
    the first latch configured to store a first count of the counter;
    the first latch configured to output the first count of the counter responsive at least in part to the first change in output state of the first power-on reset circuit;
    a select circuit coupled to receive the first count from the first latch and configured to select a target count of the counter, the target count being greater than the first count reached;
    the target count indicating when at least the first supply voltage will have reached at least a first minimum level specified for the first supply voltage;
    a second power-on reset circuit coupled to receive the first supply voltage and configured to provide a second change in output state responsive to the first supply voltage reaching a second threshold level;
    a second latch coupled to the counter and to the second power-on reset circuit;
    the second latch configured to store a second count of the counter;
    the second latch configured to output the second count of the counter responsive at least in part to the second change in output state of the second power-on reset circuit;
    the select circuit coupled to receive the first count from the first latch and the second count from the second latch;
    the select circuit configured to determine a rate of change responsive to a difference between the first count and the second count; and
    the select circuit configured to select the target count of the counter responsive to the rate of change.

8. The voltage level validity circuit according to claim 7, further comprising:
    the second power-on reset circuit coupled to receive a second supply voltage and configured to provide a second change in output state responsive to the second supply voltage reaching a second threshold level;
    the first latch coupled to the counter and to the second power-on reset circuit;
    gating logic coupling the first power-on reset circuit and the second power-on reset circuit to the first latch;

the gating logic coupled to receive both the first change in output state and the second change in output state;

the gating logic configured to provide an activation signal to the first latch to latch the first count responsive to both the first change in output state and the second change in output state during the power-on reset condition;

the first latch configured to output the first count of the counter responsive to the activation signal; and the target count indicating when the first supply voltage and the second supply voltage will have reached at least the first minimum level specified for each of the first supply voltage and the second supply voltage.

9. The voltage level validity circuit according to claim 8, wherein the first threshold level and the second threshold level are equal.

10. The voltage level validity circuit according to claim 8, wherein a time interval for reaching the target count from a time of application of the first supply voltage or the second supply voltage is within or equal to a rise-time limit specified for both the first supply voltage and the second supply voltage.

11. The voltage level validity circuit according to claim 7, wherein the select circuit is coupled to the second power-on reset circuit to receive the second change in output state, the select circuit configured to gate output of a valid signal responsive in part to the second change in output state.

12. The voltage level validity circuit according to claim 7, wherein a time interval for reaching the target count from a time of application of the first supply voltage is within or equal to a rise-time limit of the first supply voltage specified for the integrated circuit.

13. The voltage level validity circuit according to claim 12, wherein the integrated circuit is a programmable logic device.

* * * * *